United States Patent [19]
Vanderslice, Jr.

[11] 4,234,887
[45] Nov. 18, 1980

[54] V-GROOVE CHARGE-COUPLED DEVICE

[75] Inventor: Wilbur B. Vanderslice, Jr., Burlington, Vt.

[73] Assignee: International Business Machines Corporation, Armonk, N.Y.

[21] Appl. No.: 41,975

[22] Filed: May 24, 1979

[51] Int. Cl.$^3$ .................. H01L 29/78; H01L 29/06; H01L 29/04; G11C 19/28

[52] U.S. Cl. ......................... 357/24; 357/55; 357/60; 307/221 D

[58] Field of Search .................. 357/24, 55, 60; 307/221 D

[56] References Cited

U.S. PATENT DOCUMENTS

| | | | |
|---|---|---|---|
| 4,070,690 | 1/1978 | Wickstrom | 357/55 |
| 4,126,881 | 11/1978 | von Basse et al. | 357/55 |

OTHER PUBLICATIONS

Kosonocky "Charge-Coupled Devices-An Overview" 1974 Western Electronics Show and Convention Tech. Papers, vol. 18 (9/74), pp. 2/1-2/20.
Bean "Anisotropic Etching of Silicon" IEEE Trans. Electron Devices, vol. ED-25 (10/78), pp. 1185-1193.
Liu "V-Grooved Charge-Coupled Device" IBM Tech. Disclosure Bulletin, vol. 20 (3/78), p. 3851.
Kenney "V-Groove Charge-Coupled Device" IBM Tech. Disclosure Bulletin, vol. 21 (1/79), p. 3110.

Primary Examiner—Gene M. Munson
Attorney, Agent, or Firm—Howard J. Walter, Jr.

[57] ABSTRACT

A charge-coupled device shift register is formed in V-grooves provided by anisotropically etching in a substrate. insulated conductive electrodes are provided perpendicular to the V-grooves to form a plurality of parallel shift registers which transfer charges along the length of the V-grooves.

7 Claims, 7 Drawing Figures

V-GROOVE CHARGE-COUPLED DEVICE

BACKGROUND OF THE INVENTION

1. Field of the Invention

This invention relates to charge-coupled device technology and particularly to the structure and method for fabricating such devices as shift registers.

2. Description of the Prior Art

The charge-coupled device (CCD) has become an important component of semiconductor technology. The state of CCD technology has become significantly developed since it was first introduced to the semiconductor industry a number of years ago. Knowledge of the characteristics of operation of CCD's is well known and, except for minor modifications, the present state of the art is presented in the article, "Charge-Coupled Devices—An Overview", by Walter F. Kosonocky, presented at the 1974 Western Electronics Show and Convention Technical Papers, Vol. 18, September 10–13, 1974, pages 2/1–2/20. The principle circuit element used in CCD technology is the shift register which is capable of transferring electrically isolated packets of charge representing digital or analog data across or just under the surface of a semiconductor or other charge transport material. The detectability of the transferred charge packets is clearly limited by their effective size, a factor determined by the potentials used to operate the CCD and the surface area over which the potentials are effective. In recent years there has been a trend to use lower drive potentials in semiconductor devices to conserve power thus making the area of devices a significant factor. With the density of data bit positions on CCD devices expected to be on the order of 250,000, and greater, bits per semiconductor chip, area is an important design factor.

Several CCD structures have been proposed previously which utilize anisotropic etching of silicon substrates to provide semiconductor structures which include non-planar surfaces. A general description of anisotropic etching is provided in the article, "Anisotropic Etching of Silicon", by Kenneth E. Bean, *IEEE Transactions on Electron Devices*, Vol. ED-25, No. 10, October 1978, pp. 1185–1193. Basically, anisotropic etching provides a technique in which etching is effected preferentially along certain crystalographic planes in a crystalline substrate and can be used to provide self-limiting V-grooves in the surface of a silicon substrate. For example, if a silicon crystal is cut into wafers having a major surface parallel to the (100) plane, anisotropic etching can provide a V-groove in the surface of the wafer in which the sides of the groove are at an angle corresponding to the (111) planes. Anisotropic etching has been previously described as a useful technique for reducing the effective area of CCD shift registers. The article, "V-Grooved Charge-Coupled Device", by K. K. Liu, *IBM Technical Disclosure Bulletin*, Vol. 20, No. 10, March 1978, page 3851, describes a two-phase CCD shift register in which the storage electrodes are partially formed within anisotropically etched V-grooves in the surface of a semiconductor substrate. The packets of charge in such a structure are transferred between adjacent V-grooves by a transfer electrode placed on the planar surface of the substrate, as in a conventional CCD shift register. The article, "V-Groove Charge-Coupled Device", by D. M. Kenney, *IBM Technical Disclosure Bulletin*, Vol. 21, No. 8, January 1979, page 3110, describes another technique for reducing surface area of a CCD shift register in which two CCD electrodes are placed in a single anisotropically etched recess. Other applications of V-groove structures to provide an increase in density of semiconductor components is described in the article, "Capacitor for Single FET Memory Cell", by G. V. Clarke and J. E. Tomko, *IBM Technical Disclosure Bulletin*, Vol. 17, No. 9, February 1975, pages 2579–80. This article describes the use of a V-groove to form part of a MOS capacitor for a single FET memory cell in order to reduce the surface area occupied by each memory cell. U.S. Pat. No. 4,070,690 to Wickstrom is of interest as it uses a U-shaped recess in a multilayer semiconductor substrate to provide vertical MOS transistors in which conductive electrodes are provided parallel to the longitudinal extent of the recesses. U.S. Pat. No. 4,126,881 to Basse et al is also of interest as it teaches the formation of a plurality of single FET memory cells in a single anisotropically etched V-groove in which a plurality of independently selectable access lines pass perpendicularly across each V-groove.

SUMMARY OF THE INVENTION

It is an object of this invention to provide a CCD shift register having improved density per unit area of semiconductor surface without loss of signal strength.

It is another object to provide a dense CCD shift register which can easily be fabricated by conventional processing steps and which are compatible with the simultaneous manufacture of support circuits on the same substrate.

The CCD shift register of the subject invention includes a semiconductor substrate into which a plurality of parallel anisotropically etched recesses are provided which are electrically isolated from each other by intervening strips of relatively thick field oxide. A plurality of isolated electrodes are provided orthogonally to the etched recesses such that a shift register structure is formed which extends along the length of each recess. In operation as a shift register, charge packets are transferred by potential wells formed by the electrodes entirely within the recess. Due to the use of the side walls of the recesses to form the channel region of the shift register an area reduction of about 42 percent is achieved without loss of signal transferred.

The foregoing and other objects, features and advantages of the invention will be apparent from the following more particular description of the preferred embodiment of the invention, as illustrated in the accompanying drawings.

DESCRIPTION OF THE PREFERRED EMBODIMENT

Figure 1:
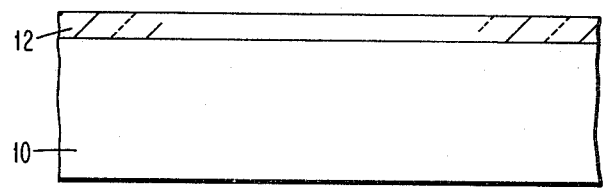
FIG. 1 through FIG. 4 are schematic sectional views of a semiconductor substrate after various steps in the process for fabricating a charged-coupled shift register of the instant invention in which the transfer and storage electrodes are positioned perpendicular to an anisotropic etched V-groove in the surface of the substrate.

Referring to FIG. 1 there is shown a monocrystalline semiconductor substrate 10, which can be, for example, doped with p-type conductivity material to have a resistivity of from 2–12 ohm-centimeters. Substrate 10 may also be an epitaxial layer deposited on a semiconductor or other material suitable for forming a monocrystalline semiconductor layer.

The substrate is oriented so that the top surface is parallel to the 100 plane of the semiconductor crystal. A relatively thick field dielectric layer 12 of, for example, about 5000 Angstroms of thermally grown or deposited silicon dioxide, is provided on the surface of substrate 10 in order to prevent parasitic conduction between portions of the substrate surface in which active devices are formed, as is well known in the art. Although a single layer 12 of dielectric is shown, those skilled in the art will recognize that other dielectric field structures are also suitable, such as, multiple dielectric layers, semi- or fully-recessed oxide formed by the use of an oxidation inhibiting silicon nitride layer located initially over active device regions, and various other combinations of well known oxidation and ion implantation steps previously used to control the threshold voltage under field dielectric layer 12.

After formation of field dielectric layer 12, a photolithographic etching step is used to selectively expose a plurality of parallel rectangular regions in which the desired charge-coupled devices will subsequently be formed. The extent of the rectangular regions is determined by the intended size of the charge-coupled device shift register and are the approximate length of the desired shift registers. The lateral spacing between adjacent rectangular regions should be chosen so as to provide adequate isolation between charge coupled shift registers to be formed within the rectangular regions and may vary considerably depending upon the particular field structure used as well as the electrical parameters of devices formed by a particular process. Next, the substrate is etched by an anisotropic etchant, such as, ethylene diamine pyrocatechol and water, or other known anisotropic etchant to provide a plurality of self-terminating longitudinal V-shaped grooves or recesses in the exposed semiconductor substrate. For a detailed description of anisotropic etching of silicon, the article by K. E. Bean, *IEEE Transactions on Electronic Devices*, Vol. ED-25, No. 10, October 1978, pp. 1185–1192, may be referred to and is herein incorporated by reference. The etched V-grooves will have their sides and end walls at an angle of 54.74° as determined by the (111) planes within the crystalline substrate 10. As under etching around the edges of the field dielectric layer 12 is undesired, it may be advisable to expose the semiconductor substrate to a dip etch to partially remove any overhanging portions of layer 12 so the side edges of the etched field dielectric regions are substantially smooth and continuous with the walls of the V-grooves.

Figure 2:
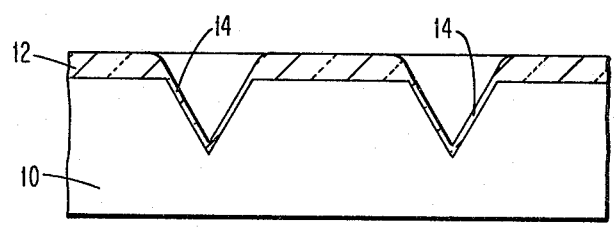

Following the etching of the V-grooves, a relatively thin layer 14 of, for example, thermal silicon dioxide is provided within the V-grooves as shown in FIG. 2. Layer 14 may be about 500 Angstroms in thickness.

Next, a first layer of conductive material is blanket deposited over the V-etched and oxidized substrate. The conductive layer, about 3,000 Angstroms in thickness, is preferably formed with a self-passivating conductive material such as doped poly-silicon or a refractory metal.

After deposition of first conductive layer a second photolithographic step is performed to define a plurality of parallel and regularly spaced strip-like electrodes 16 extending orthogonally to the longitudinal dimension of the V-grooves so that each defined electrode passes over one V-groove, a section of field dielectric 12 and another V-groove and so on. The first conductive layer may also be simultaneously patterned to provide electrodes for additional devices not forming a part of the charge coupled shift register.

Figure 3:
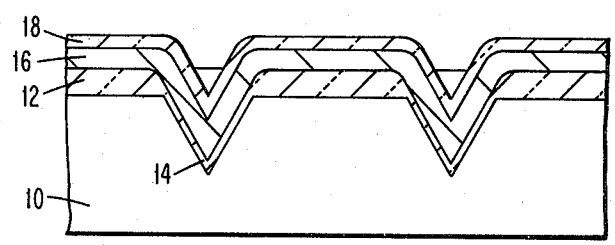

After defining first conductive electrodes 16, a dielectric layer 18 is provided to passivate and isolate these electrodes. Dielectric layer 18 is preferably a thermal oxide formed by oxidation of electrodes 16, but could also be deposited by a chemical vapor deposition process. Layer 18 is preferably about 1500 Angstroms in thickness. The resulting structure to this point in the process is shown in cross-section in FIG. 3.

After passivation of electrodes 16, a second layer of conductive material is blanket deposited over the substrate. A third photolithographic step is performed to define a second plurality of parallel and regularly spaced strip-like electrodes 20 overlapping portions of previously defined electrodes 16 and extending parallel to electrodes 16. The physical and electrical relationship between electrodes 16 and 20 is well known in the charge coupled device art, see for example, the article, "Charge-Coupled Devices—An Overview", W. F. Kosonocky, 1974 Western Electronics Show and Convention Technical Papers, Vol. 18, Sept. 10–13, 1974, pages 2/1–2/20, for various techniques and materials useful for forming electrode structures for charge coupled devices.

After the formation of electrodes 20 the charge coupled shift register may be further processed in a manner suitable to the specific application intended.

Figure 4:
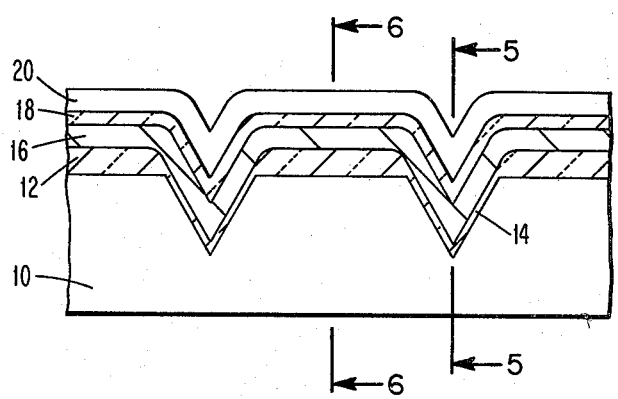
Figure 5:
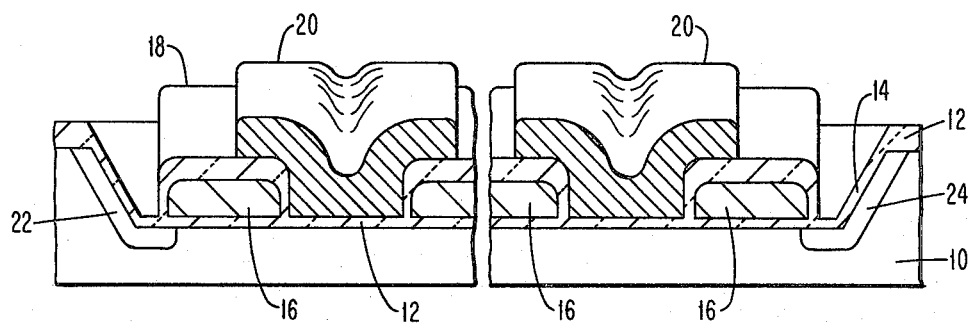
FIG. 5 is a sectional view taken along the line 5—5 of FIG. 4 and shows the relationship of the electrodes within the V-groove.

FIG. 5 shows a sectional schematic view taken along the line 5—5 of FIG. 4 through the apex of one of the V-grooves. N-type regions 22 and 24 are representative of p-n junction regions adjacent to the input and output ends of the shift register which may be provided by various well known techniques, such as, diffusion or ion implantation. It should be noted that the sectional portions of electrodes 16 and 20 which are within the recess formed by the V-groove represent that of a charged coupled device shift register similar to prior art devices and thus have similar characteristics. Although not specifically illustrated, the entire cross-section, i.e., along the sloping side walls of the V-groove, as well as, at the apex within the V-groove is identical to that of FIG. 5. Thus, the relative surface area occupied by the charge coupled shift register, as determined in the plane of the major face of the semiconductor or substrate, is 1.73 times larger in the subject invention than that provided in the same surface area by a planar shift register.

Figure 6:
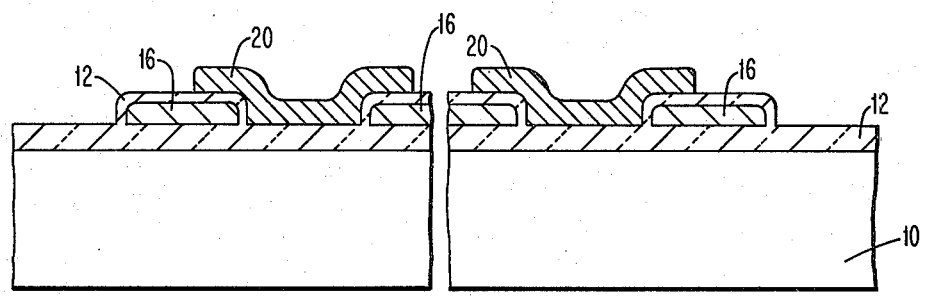
FIG. 6 is a sectional view along the line 6—6 of FIG. 4 and shows the relationship of the electrodes as they pass over the thick field oxide.

FIG. 6 is a sectional schematic view taken along the line 6—6 of FIG. 4 and shows electrodes 16 and 20 as they pass over field dielectric 12 which isolates them from the surface of substrate 10.

Figure 7:
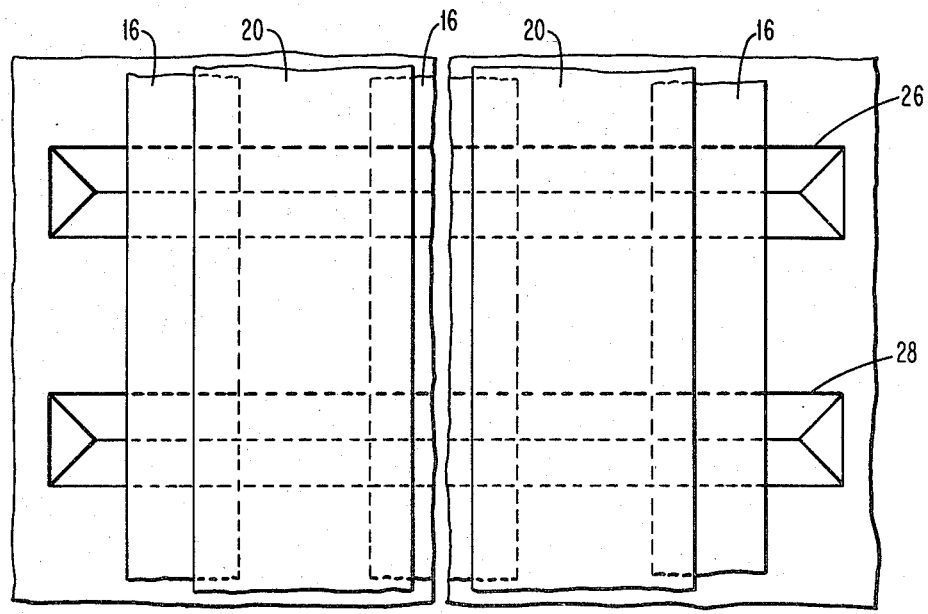
FIG. 7 is a schematic plan view of the shift register of FIGS. 1-6 and shows the orthogonal relationship between the V-groove and the overlying charge coupled shift register electrodes.

FIG. 7 is a schematic plan view of the shift register of the subject invention showing the orthogonal orientation of the charge coupled device electrodes 16 and 20 with respect to the V-grooves 26 and 28 formed in the surface of semiconductor substrate 10.

Although the subject invention has been described with respect to a single preferred embodiment, those skilled in the art will recognize that the invention has application in other forms which are known variations to charge-coupled device technology. Thus, various additional electrode structures may be implemented such as triple layer structures. In addition, various operating modes, such as two, three or multiple phase operation, may also be implemented. While the invention has been illustrated as relying upon anisotropically etched silicon, other techniques for providing subsurface recesses to increase the related active device surface area may also be implemented. For example, partial anisotropic etching of the V-groove to form a U-shaped or flat bottomed recess may also be used. Other wet or dry etching techniques, such as, reactive ion etching, are also envisioned as techniques by which a recessed surface region can be formed. Anisotropic V-groove etching is clearly preferred at present in view of the ease with which overlying conductors can be provided to uniformly conform to the walls of the recess and provide a substantially uniform thickness. Deposition of conductive electrodes may also be implemented by vacuum or ionization techniques which may more suitably provide required electrode characteristics in structures formed in recesses having more vertical side walls.

While the invention has been particularly shown and described with reference to preferred embodiments, it will be understood by those skilled in the art that the foregoing and other changes in form and detail may be made therein without departing from the spirit and scope of the invention.

What is claimed is:

1. A charge transfer device comprising:

a semiconductor substrate having at least one longitudinal recess having a length substantially greater than its width formed in a surface thereof;

a plurality of longitudinal charge transfer electrodes positioned over and substantially perpendicular to said recess for effecting charge transfer of carriers from under an electrode to under an adjacent electrode within and along the length of said recess in response to signals applied to said electrodes; and isolation means between said charge transfer electrodes and the portions of said surface of said substrate adjacent to said recess for preventing charge transfer from occurring in said portions of said surface in response to said signals.

2. The charge transfer device of claim 1 wherein said plurality of charge transfer electrodes comprise first and second groups of electrodes in which each of one of said second groups of electrodes at least partially overlaps at least one adjacent electrode of said first group of electrodes.

3. The charge transfer device of claim 2 wherein at least said first group of electrodes comprises a self-passivating conductive material.

4. The charge transfer device of claim 3 wherein said self-passivating conductive material comprises polysilicon.

5. The charge transfer device of claim 1 wherein said recess has a V-shaped cross-section.

6. The charge transfer device of claim 1 wherein said semiconductor substrate is monocrystalline silicon and said recess is formed by anisotropically defined crystallographic planes in said substrate.

7. The charge transfer device of claim 4 wherein said surface of said monocrystalline silicon substrate is oriented parallel to a 100 plane of said substrate and said recess is at least partially defined by 111 planes in said substrate.

* * * * *